(12) United States Patent
Ying et al.

(10) Patent No.: US 10,203,875 B1
(45) Date of Patent: Feb. 12, 2019

(54) METHODS AND SYSTEMS FOR IMPLEMENTING HIGH BANDWIDTH MEMORY COMMAND ADDRESS BUS TRAINING

(71) Applicant: Cadence Design Systems, Inc., San Jose, CA (US)

(72) Inventors: Guangxi Ying, Beijing (CN); Zhehong Qian, Shanghai (CN); Liang Huo, Beijing (CN); Yanjuan Zhan, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 219 days.

(21) Appl. No.: 15/199,921

(22) Filed: Jun. 30, 2016

(51) Int. Cl.
G06F 12/00 (2006.01)
G06F 13/00 (2006.01)
G06F 3/06 (2006.01)
G06N 99/00 (2010.01)

(52) U.S. Cl.
CPC .......... *G06F 3/0604* (2013.01); *G06F 3/0635* (2013.01); *G06F 3/0673* (2013.01); *G06N 99/005* (2013.01)

(58) Field of Classification Search
CPC .......... G06F 12/00; G06F 13/00; G06F 13/06; G11C 29/14
USPC .................. 711/100, 105, 154, 200
See application file for complete search history.

(56) References Cited

U.S. PATENT DOCUMENTS

| 9,851,744 | B2 * | 12/2017 | Dearth | G06F 1/10 |
| 9,881,664 | B1 | 1/2018 | Ying et al. | |
| 2005/0135621 | A1 * | 6/2005 | Burdine | G06F 7/584 380/265 |
| 2017/0328951 | A1 * | 11/2017 | Liew | G11C 8/04 |

* cited by examiner

*Primary Examiner* — Tuan V Thai
(74) *Attorney, Agent, or Firm* — Vista IP Law Group, LLP

(57) ABSTRACT

A method to initiate Command Address (CA) training on High Memory Bandwidth is provided to optimize CA bus setup and hold times relative to the memory clock. HBM protocol does not define any way to support CA training, but defines a very high working frequency. The high frequency makes it very difficult to ensure the timing on CA Bus-Row/Column command bus and CKE. As such, executing CA training before any normal operation is necessary to ensure the best setup/hold timings. The CA training takes advantage of protocol based instructions to initialize and implement CA training.

12 Claims, 13 Drawing Sheets

METHODS AND SYSTEMS FOR IMPLEMENTING HIGH BANDWIDTH MEMORY COMMAND ADDRESS BUS TRAINING

BACKGROUND

Command Address (CA) training is a process to optimize the CA bus (Row/Column command bus and CKE) setup and hold times relative to the memory clock. CA training helps the memory controller compensate for signal skew while making sure data input setup and hold timing (as well as command and address input timing) requirements are met. Without proper CA training, the memory can result in such failures as higher bit error rates and destabilize system operations.

In a typical memory system of a computer system, a memory controller facilitates the access of memory modules in the computer system. The memory controller transmits a host of signals to the memories including address signals, control signals, clock signals, etc. to access data from the memories or to send data to the memory. In order to send and receive correct data to and from the memories, the memory controller should train (or modify) CA signals with respect to a clock signal.

Memory controllers use CA training to improve timing margins of the CA bus. Typically, the memory controller trains the CA signals by transmitting a particular CA signal with respect to a clock signal to the memory and then analyzing a response from each memory to ascertain if the memory correctly received the particular CA signal. Upon a successful response from the memory, the memory controller delays the phase of the particular CA signal with respect to the clock signal and then re-transmits the delayed particular CA signal with a delayed phase to the memory. The memory controller then analyzes a response from the memory to ascertain if the memory correctly received the delayed particular CA signal.

High Bandwidth Memory (HBM) is an emerging memory standard defined by the JEDEC organization. HBM is a high-performance dynamic random access memory (DRAM) that uses wide-interface architecture to achieve high-speed and low-power operation. The HBM subsystems involve different types of memory controllers (full-speed, half-speed), HBM PHY (mixed-signal physical interface), and HBM Dynamic Random Access Memory (DRAM). The HBM subsystem is especially suitable for applications involving high performance graphics and computing, high end networking and communication devices, and memory-hungry processors. The HBM may also be fitting to enable systems with extremely high bandwidth requirements like future high-performance GPUs. The HBM standard applies stacked DRAM die and is built using through-silicon vias technologies to support bandwidth from 1 GB/s to 2 GB/s per signal at 400-1000 MHz DDR. HBM achieves such high bandwidth while using less power by stacking up to eight DRAM dies, including an optional base die with a memory controller, which are interconnected by through-silicon vias and microbumps.

The higher HBM speeds require that DRAM channels be carefully tuned for optimal signal quality and DDR bus timing. HBM CA bus signals operate at frequencies (e.g., 1.6 Gbps or 2.0 Gbps) which makes it difficult to satisfy CA bus setup and hold timings. As such, executing CA training before any normal operation becomes necessary to ensure correct timing on CA Bus when HBM works at such high frequencies. With the rise of HBM as the next generation memory technology, there is a need to implement CA training even though HBM protocol does not provide a specific CA training mechanism.

Currently, CA training mechanisms are explicitly defined by mobile double data ram (DDR) protocols, but HBM does not explicitly define a specific mechanism to execute a CA training process. For example, HBM protocol does not define a specific "CA training mode" such as in LPDDR3 and LPDDR4 protocols. Unlike LPDDR3's built in training mechanisms, HBM CA bus signals cannot be mapped to DQ and patterns, which are defined for training on CA bus by LPDDR3 protocol, and cannot be returned via DQ to the HBM controller. Furthermore, HBM protocol does not explicitly ensure that MRS command can be sent correctly to HBM DRAM at any frequency, which is defined by LPDDR4 protocol. As such, the HBM controller cannot ensure that HBM DRAM can be set to a correct mode via MRS without CA training when the frequency is very high. Therefore, the HBM controller cannot implement a CA training process by using similar ways as LPDDR3 or LPDDR4 controllers.

Therefore, there is a need for methods, and a system for initializing and implementing a CA training process for HBM to optimize CA bus setup and hold times.

SUMMARY

Embodiments of the present invention provide an approach for using protocol based instructions to implement CA training for optimizing CA bus setup and hold times. According to some embodiments, an approach is disclosed to send a CA training pattern to the HBM DRAM; read back the output pattern from HBM DRAM; determine whether a CA bus timing issue exists by comparing the output pattern with an expected output pattern; adjust the delay line on C/R bus and CKE corresponding to a delta value between output pattern with the expected output pattern; and determine whether CA training is complete. Techniques disclosed herein are described in the context of IEEE 1500 protocols and test signals, but the techniques can be applied to different standards and architectures.

According to some embodiments, disclosed is an approach for taking advantage of protocol based test instruction signals to initiate and implement CA training mode. According to some embodiments, disclosed is an approach for using DFI signals to initiate and implement CA training.

Further details of aspects, objects, and advantages of the invention are described below in the detailed description, drawings, and claims. Both the foregoing general description and the following description are exemplary and explanatory, and are not intended to be limiting as to the scope of the invention.

BRIEF DESCRIPTION OF THE DRAWINGS

The drawings illustrate the design and utility of embodiments of the present invention, in which similar elements are referred to by common reference numerals. In order to better appreciate the advantages and objects of embodiments of the invention, reference should be made to the accompanying drawings. However, the drawings depict only certain embodiments of the invention, and should not be taken as limiting the scope of the invention.

DETAILED DESCRIPTION

Figure 1:
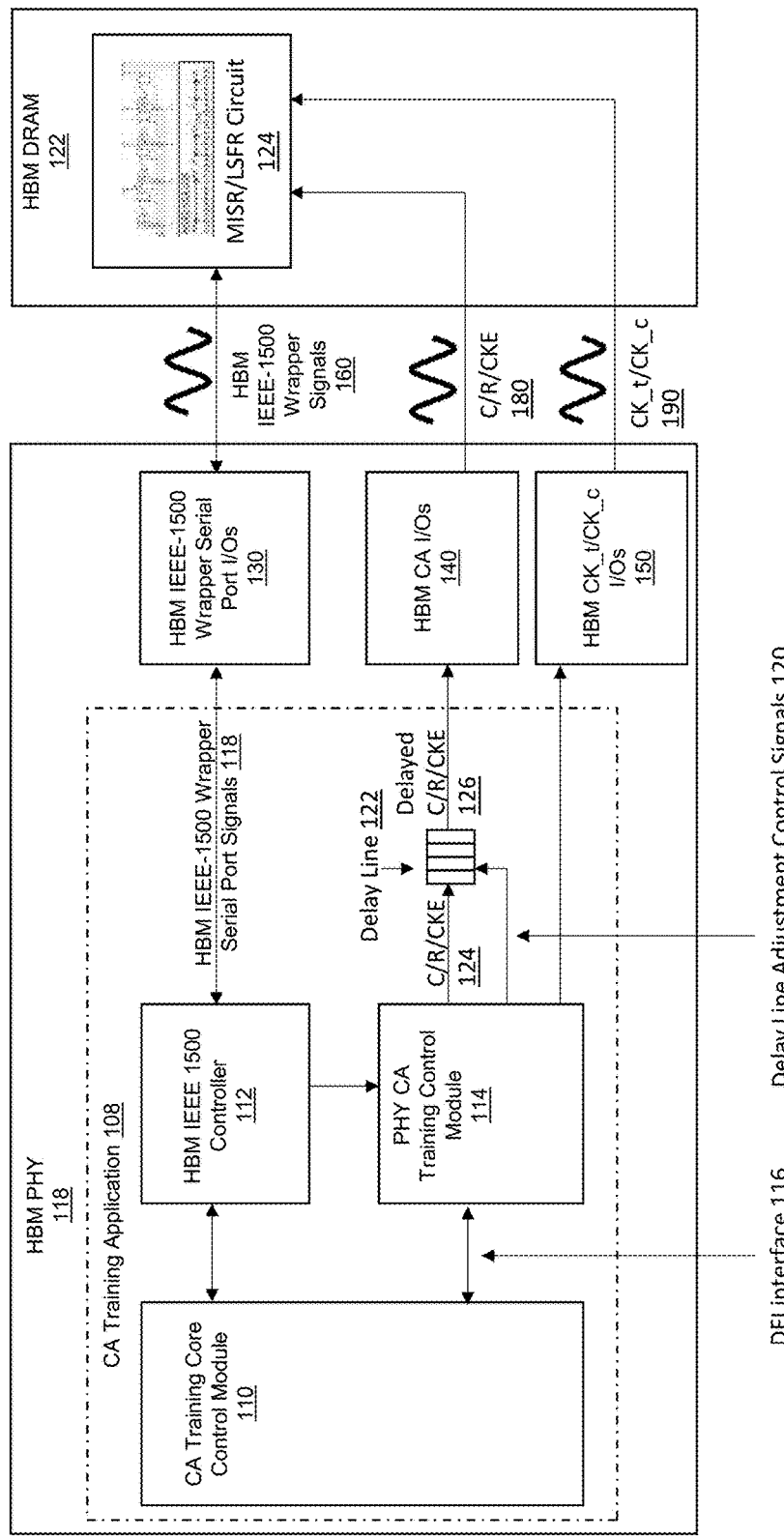
FIG. 1 is a schematic diagram illustrating an example system for CA training for HBM according to some embodiments of the invention.

Various embodiments are described hereinafter with reference to the figures. It should be noted that the figures are not drawn to scale. It should also be noted that the figures are only intended to facilitate the description of the embodiments, and are not intended as an exhaustive description of the invention or as a limitation on the scope of the invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, references throughout this specification to "some embodiments" or "other embodiments" mean that a particular feature, structure, material, or characteristic described in connection with the embodiments is included in at least one embodiment. Thus, the appearances of the phrase "in some embodiments" or "in other embodiments", in various places throughout this specification are not necessarily referring to the same embodiment or embodiments.

Command Address bus training is a training process that optimizes the CA bus setup and hold times relative to a memory clock. CA training is especially important to meet setup and hold timing when working at high frequencies. Unlike many other types of mobile DDR (such as LPDDR3 and LPDDR4 protocols) that explicitly define built-in specific CA training modes, HBM does not define any way to support CA training mode, but defines a very high working frequency (e.g., a 1.6 Gbps data rate with a frequency of 800 MHZ). Moreover, HBM CA bus signals also work as a double data rate, which also makes it difficult to satisfy CA bus setup timing at higher frequencies. When the working frequency is very high and the CA buses operate as a double rate it becomes especially difficult to satisfy CA bus setup/hold timings. Therefore, executing CA training before any normal operation is necessary to meet setup/hold timing at these high frequencies and a double data rate.

As computing requirements are requiring more memory usage, any errors in the memory system (e.g., caused by a CA signal with a phase with respect to a clock signal that results in accessing incorrect data from the memory module to the memory controller) results in a loss of time. Moreover, such errors may also lead to lengthy boot-up times. HBM protocol does not explicitly define a specific mechanism to execute CA training process as LPDDR3 and LPDDR4 protocol. Furthermore, HBM protocols cannot use a similar training process by using the same or similar methods as LPDDR3 and LPDDR4 because of the differences in HBM protocol and LPDDR3 and LPDDR4 protocols. Therefore, HBM needs a method to implement CA training.

For example, HBM protocol does not define a specific "CA training mode" such as in LPDDR3 and LPDDR4 protocols. LPDDR3 and LPDDR4 both have defined mode registers to enter and exit CA training mode. HBM protocol does not define these registers to initialize and end CA training. Therefore, HBM DRAM must take advantage of utilizing built in test instructions rather than registers to initialize and end CA training.

Unlike LPDDR3's built in training mechanisms, HBM CA bus signals cannot be mapped to DQ and patterns, which are defined for training on CA bus by LPDDR3 protocol, and cannot be returned via DQ to the HBM controller. Furthermore, HBM protocol does not explicitly ensure that MRS command can be sent correctly to HBM DRAM at any frequency, which is defined by LPDDR4 protocol. As such, the HBM controller cannot ensure that HBM DRAM can be set to a correct mode via MRS without CA training when the frequency is very high.

Embodiments of the invention provide an approach for implementing CA training for HBM. FIG. 1 shows an architecture of a system according to some embodiments of the invention. In certain embodiments, a memory controller is coupled to the HBM DRAM device. The memory controller may communicate with the HBM DRAM device via signals, such as a control signal, a clock signal, command signals, etc. In certain embodiments, the memory controller that is coupled to a HBM DRAM device is operable to train the control signal using IEEE standard instructions, by sending a CA training pattern to the HBM DRAM device and adjusting the delay line on the C/R and CKE bus by comparing the output pattern with expected output pattern.

In this system, the control signals are used to qualify when the command signal encoding should be latched by the memory device. It is important to establish stable control signal timing prior to any CA training relative to the clock where the clock is generated by the memory controller and received by the memory device, and prior to any training of the data base timing. It may also be desirable to perform CA training before memory is accessed as those parameters cannot be updated during operation without disturbing memory traffic.

Techniques disclosed herein are described in the context of IEEE 1500 protocols and test signals, but the techniques can be applied to different standards and architectures.

FIG. 1 is a schematic diagram illustrating a system which may be employed in some embodiments of the invention to implement CA training for HBM. The system may include, for example, HBM PHY (High Memory Bandwidth Physical Layer) 118 and HBM DRAM 122. The HBM IEEE 1500 Wrapper Serial Port I/Os 130, HBM CK_t/CK_c I/Os 150 and HBM CA I/Os 140 enable the HBM PHY 118 to communicate with the HBM DRAM 122. The DFI interface 116 defines the DDR PHY Interface ("DFI") signals, timing parameters and programmable parameters to transfer control information and data over the DFI, to and from DRAM devices, and between a memory controller and the HBM PHY 118.

A typical memory controller facilitates the access of a memory module in the computer system, where the memory module may include one or more memories. The memory controller transmits a host of signals to the memory including address signals, control signals, clock signals, etc. to access data from the memory or to send data to the memory. In one embodiment, the memory controller communicates with the HBM DRAM 122 via signals including, but not limited to, a control signal, a clock signal, command signals, and any other signals to cause communication between the memory controller and the HBM DRAM 122.

The HBM PHY 118 may include a CA Training Application 108 which may comprise CA Training Core Control Module 110, a HBM IEEE 1500 Controller 112, and a PHY CA Training Control Module 114 to implement and perform CA training. Note that in the following drawings of the embodiments, signals are represented with lines. Some lines may have arrows at one end to indicate the primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The DFI is an interface protocol that defines DFI signals, timing parameters and programming parameters to transfer control information and data over the DFI to and from DRAM devices. The IEEE standard requires that cores include an IEEE 1500 Wrapper to be compliant. The standard was created to address test complexity of System on Chips (SoC) and provides a standard interface and a set of rules for creation of an isolation boundary between a core and the logic external to the core. The purpose of the isolation boundary or wrapper is to allow for isolated tests of the core with minimal signals that must be ported out to the SoC level.

HBM PHY 118 generally receives HBM DRAM row-col commands, data, parity, etc. from memory controllers through DFI interfaces and passes them to HBM memory along with the use of HBM DRAM interface. It deals with two different interfaces and supports multiple frequency ratios for DFI interfaces. HBM PHY 118 is ideally required to support all HBM memory features like frequency ratios, data rates, memory sizes, pseudo channel modes, legacy modes, DBI, DM, etc.

The wrapper comprises wrapper cells for each functional input and output port. This wrapper comprises a Wrapper Boundary Register (WBR), a Wrapper Instruction Register (WIR) and a Wrapper Bypass Register (WBY). There is also a set of signals called the Wrapper Serial Port (WSP) that are used for all serial instructions and any communication with the WIR or the WBY. The IEEE 1500 standard mandates one serial instruction so all IEEE 1500 wrapper cores must have eight required ports. The eight required ports are listed below in Table A:

TABLE A

Wrapper Serial Port Signals

| Signals | Description |
| --- | --- |
| WRST_N | Reset for IEEE 1500 logic. Leaves the wrapper in functional mode. |
| WSI (Wrapper Serial Input) | Used as the scan input. |
| WSO (Wrapper Serial Output) | Used as the scan output |

TABLE A-continued

Wrapper Serial Port Signals

| Signals | Description |
| --- | --- |
| WRCK (Wrapper Clock) | Always clocks the WIR, WBY and during serial instructions must clock the WBR. |
| ShiftWR | The shift enable signal. |
| UpdateWR | The update enable signal. |
| CaptureWR | The capture enable signal. |
| SelectWIR | Selects between the instruction register (i.e., WIR) and a data register (e.g., WBR, WBY) |

The WIR requires the shift and update events, but has an optional capture event. The WBR requires the shift and capture event, but may not require the update event or the transfer event as these are WBR cell dependent.

The HBM DRAM 122 is a memory chip which can support low power consumption, ultra-wide communication lanes, and stacked configurations. HBM defines two physically independent CA buses: Row command and Column command (C/R) bus and a control signal (CKE). HBM DRAM 122 memory connects with HBM PHY 118 with the HBM JEDEC interfaces. HBM protocol defines a 1.6 Gbps data rate with a frequency of 800 MHz. This HBM DRAM 122 memory can receive HBM commands, data, data mask, parity, etc. from HBM PHY 118. Accordingly, each HBM device may have vendor-specific features, functions and timings.

According to HBM protocol, inside HBM DRAM 122, HBM AWORD block implements a 30-bit MISR/LSFR circuit ("AWORD MISR/LSFR circuit") 124 which is comprised of DDR Rise and Fall bits for the 15 row and command bits, plus CKE. The AWORD MISR/LSFR Circuit 124 has 3 modes: LSF Mode, MISR Mode and Register Mode. When the AWORD MISR/LSFR Circuit 124 is set to "Register Mode," its contents can be set via Row/Column (C/R) command bus and a HBM protocol control system (CKE signal). Then, the contents can be read out via WSO port, another IEEE standard 1500 port signal, after a test instruction is sent.

The CA Training Application 108 executes in the computation device, where the CA Training Application 108 may be implemented in hardware, software, firmware or any combination thereof. The CA Training Application 108 allows the HBM PHY 118 to implement and perform CA training on the HBM DRAM 122 using IEEE 1500 ports and test instructions rather than registers.

In one embodiment, the CA Training Core Control module 110 implements a main control logic to control the CA training procedure in the HBM DRAM 122, where the CA Training Core Control module 110 may be implemented in hardware, software, firmware or any combination thereof. The CA Training Control Module 110 is generally responsible for requesting the HBM IEEE 1500 Controller 112 to send instructions to the HBM DRAM 122. The CA Training Control Module 110 also controls the PHY CA Training Control Module through DFI signals. The DFI interface 116 defines signals, timing parameters and programmable parameters to transfer control information and data over the DFI, to and from DRAM devices.

In some embodiments, the CA Training Control module 110 requests IEEE 1500 operations by sending the HBM IEEE 1500 Controller 112 instructions. It is important to note that HBM protocol requires HBM DRAM 122 to support IEEE Standard 1500 and defines test instructions which are sent via IEEE standard 1500 port. Techniques disclosed herein are described in the context of IEEE 1500 protocols and test signals, but the techniques can be applied to different standards and architectures. In some embodiments, two of the test instructions may be used for CA training: AWORD_MISR and AWORD_MISR_CONFIG. In some embodiments, the CA Training Control module 110 controls the PHY CA Training Control module 114 by asserting DFI signals across the DFI interface 116.

The HBM IEEE 1500 Controller module 112 implements a logic to operate with the IEEE 1500 standards. In some embodiments, the HBM IEEE 1500 Controller 112 sets modes, reads AWORD_MISR contents, compares patterns and informs the HBM PHY 118 of comparison results. The HBM IEEE 1500 Controller 112 communicates with the HBM DRAM 122 by sending and reading HBM IEEE 1500 Wrapper Serial Port Signals 160 through the HBM IEEE 1500 Wrapper Serial Port I/Os 130.

The PHY CA Training Control module 114 implements a logic to send CA training patterns, evaluate the training results, and adjust delay line on a Command Row and Clock (C/R/CKE) bus paths. The PHY CA Training Control module 114 communicates with the HBM DRAM 122 through the HBM CA I/Os 140 and HBM CK_t/CK_c I/Os 150. The PHY CA Training Control Module 114 can adjust the Delay Line 122 by sending Delay Line Adjustment Control Signals 120 to the Delay Line 122. The HBM CA I/Os 140 take the Delayed C/R/CKE 126 signal and sends them as C/R/CKE signals 180 to the MISR/LSFR Circuit 124. When C/R/CKE 180 signals are sent to MISR/LSFR Circuit 124 the PHY CA Training Control Module 114 also simultaneously sends two pulses of clock signal to the MISR/LSFR Circuit 124 via HBM CK_t/CK_c I/O 150, because according to HBM protocol, MISR/LSFR Circuit 124 uses CK_t/CK_c to capture C/R/CKE 180 signals.

Figure 2:
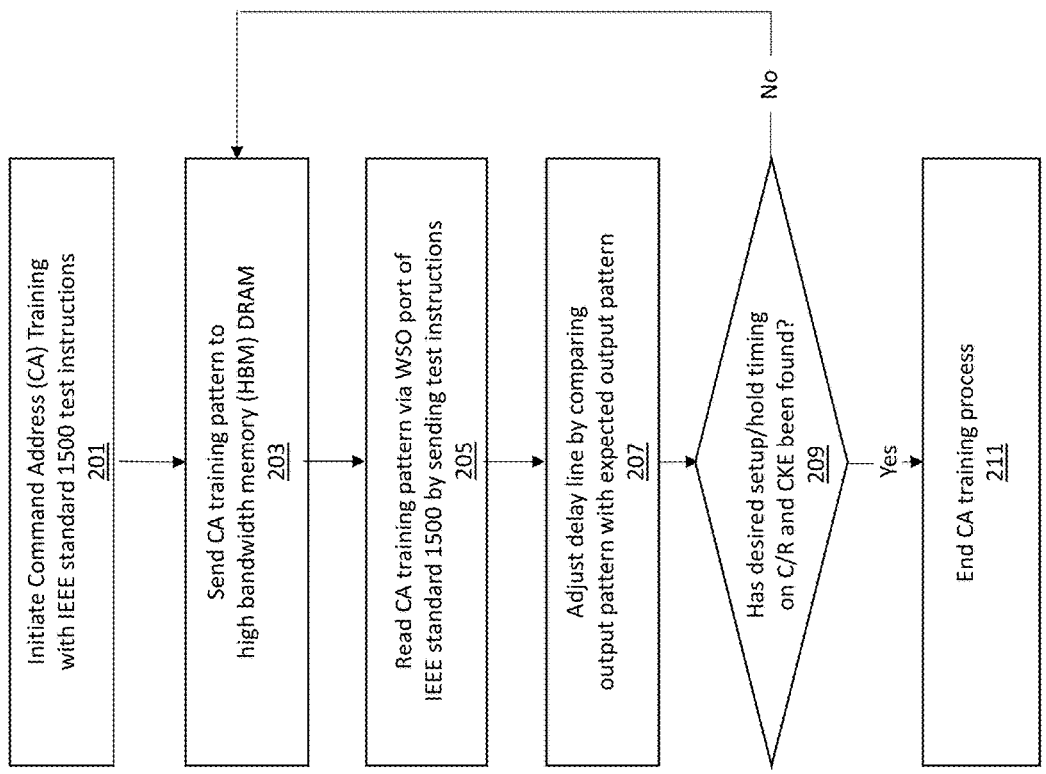
FIG. 2 is a flow diagram illustrating a method for implementing CA training for HBM according to embodiments of the invention.

FIG. 2 shows a flowchart of an approach to implement CA training for HBM via IEEE 1500 standard port. In some embodiments, CA training may occur before normal operation to ensure timings on CA bus. The operations shown in FIG. 2 may be performed at least by the CA Training Application 108, which control the operations performed on the HBM DRAM 122.

CA training may be initiated through three physically independent CA buses: Row/Column (C/R) command bus, a HBM protocol control system (CKE signal) and a HBM protocol clock signal (CK_t/CK_c 190, a differential clock signal) via IEEE standard 1500 port at 201. HBM protocol requires HBM DRAM to support the IEEE standard 1500 and defines test instructions which are sent via a IEEE standard 1500 port. In some embodiments, CA training may use two types of test instructions—a test read instruction (e.g., AWORD_MISR) and test configuration instruction (e.g., AWORD_MISR_CONFIG) and not registers for initializing and implementing CA training.

Next, the PHY CA Training Control Module 114 sends a CA training pattern via the C/R bus and CKE 180 to HBM DRAM 122 at 203. At the same time, PHY CA Training Control Module 114 also send two pulses on CK_t/CK_c 190, the differential clock signal. According to HBM protocol, the CA training pattern is stored in the AWORD MISR/LSFR Circuit 124.

The HBM IEEE 1500 Controller 112 sends a test instruction to the HBM DRAM 122 to read the contents of the AWORD MISR/LSFR Circuit 124 via WSO ports rather than via DQ bus at 205. The HBM IEEE 1500 Controller 122 captures the WSO to get the contents of the AWORD MISR/LSFR Circuit 124 to compare the output pattern with the expected output pattern stored in the registers. The HBM IEEE 1500 Controller 112 then sends the comparison results to the HBM PHY 118.

Then, the PHY CA Training Control Module 114 adjusts Delay Line 122 by reading the comparison results at 207. The PHY CA Training Control Module 114 determines whether the desired setup/hold timing on C/R and CKE has been found at step 209. If the desired setup/holding time has not been found, then steps 203 to 207 are repeated until the desired setup/hold timing on C/R and CKE is found. Otherwise, the PHY CA Training Core Control Module 114 ends the CA training process at 211.

FIGS. 3A-F illustrates diagrams showing components to implement CA training where CA training is implemented. Here, the interactions between the components and how they communicate with each other are shown.

Figure 3A:
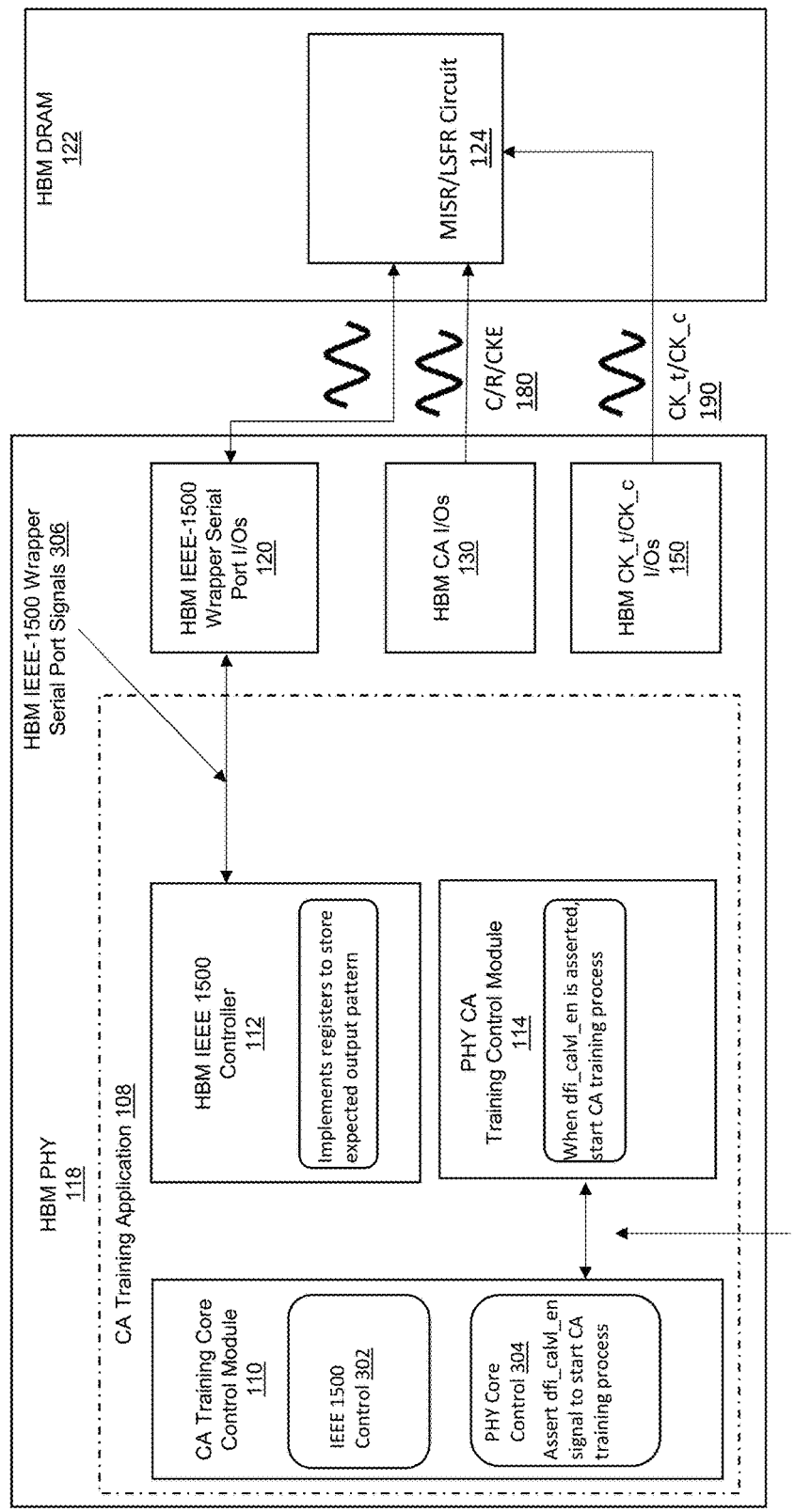
FIGS. 3A-F show a diagrams for implementing CA training for HBM where CA training is implemented, according to some embodiments of the invention.

FIG. 3A illustrates starting the CA training process by sending signals across the DFI interface to initiating the C/A training process. Specifically, CA Training Application 108 initiates the CA training mechanism by asserting a DFI signal (e.g., dfi_calvl_en) not registers and to instruct the PHY CA Training Control Module 114 to start the CA training process. The CA Training Core Control module 110 may comprise the IEEE 1500 Control 302 and the PHY Core Control 304. The HBM PHY 118 communicates to the HBM IEEE 1500 Controller 112 by using protocol based instructions and to the PHY CA Training Control module 114 through DFI signals. The HBM DRAM 122 and HBM IEEE 1500 Controller 112 communicate with each other via the HBM IEEE 1500 Wrapper Serial Port I/Os 120. The PHY CA Training Module 114 and the HBM DRAM 122 communicate with each other through the HBM CA I/Os 130 and HBM CK_t/CK_c I/Os 150. In some embodiments, the HBM IEEE 1500 Controller 112 may also implement registers to store the expected output pattern.

Figure 3B:
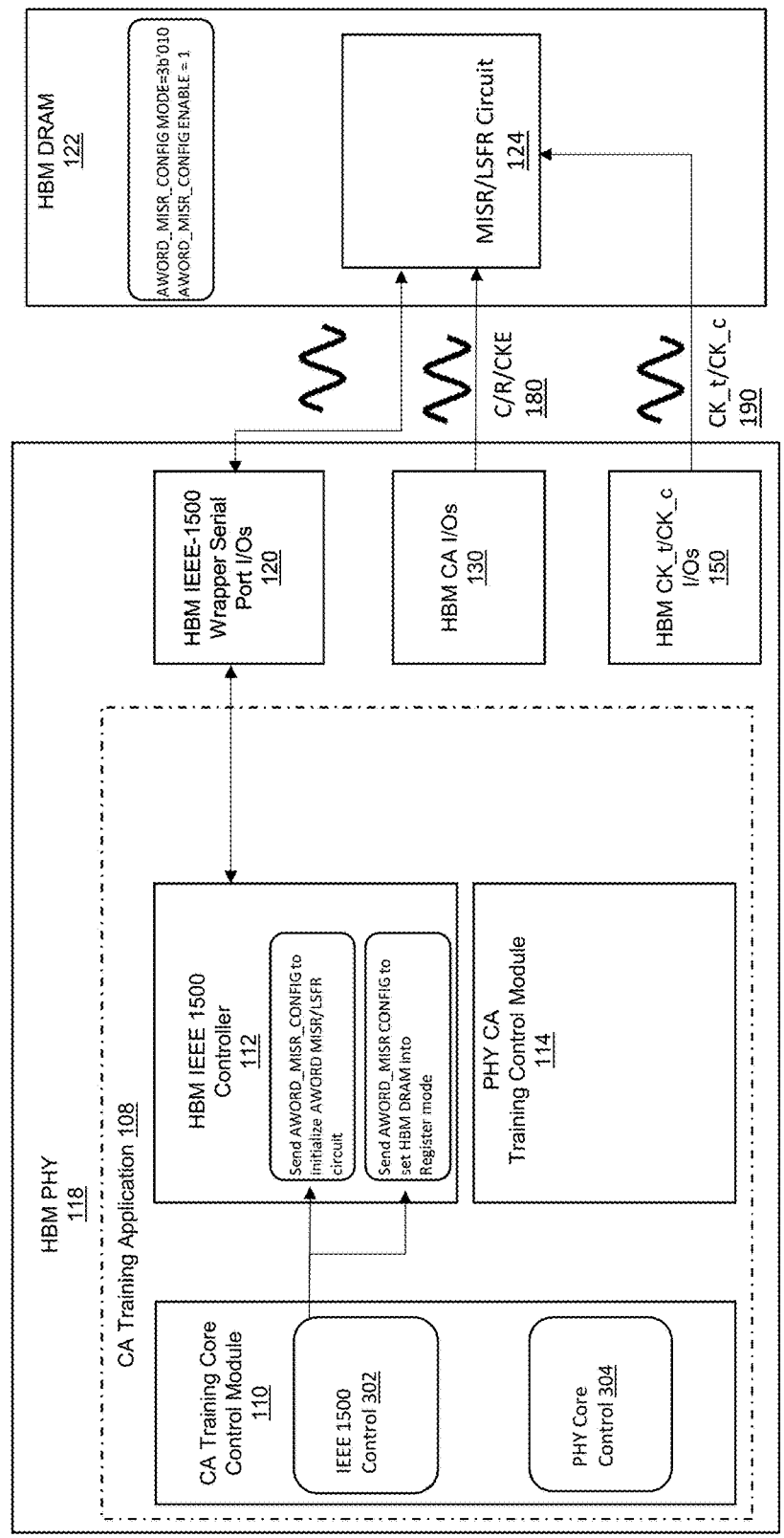

FIG. 3B illustrates the CA Training Application initializing CA training mode by configuring the HBM DRAM into the appropriate mode for setting contents of the HBM DRAM and for reading out the contents of the HBM DRAM with test instructions. The CA Training Application 108 initializes CA training by sending a test instruction and not a register to set the AWORD MISR/LSFR circuit 124 into "Register Mode." When the circuit is in "Register Mode," its contents can be set via the C/R bus and CKE, and its contents can be read out via WSO port rather than a DQ I/O by sending a test configuration instruction (e.g., AWORD_MISR). In some embodiments, the IEEE 1500 Control 302 requires HBM IEEE 1500 Controller 112 to send a test configuration instruction (e.g., AWORD_MISR_CONFIG) to initialize the AWORD_MISR/LSFR Circuit 124. Next, in some embodiments, the IEEE Control 302 requires HBM IEEE 1500 Controller 112 to send a configuration test instruction to set AWORD MISR/LSFR Circuit 124 into "Register Mode."

Figure 3C:
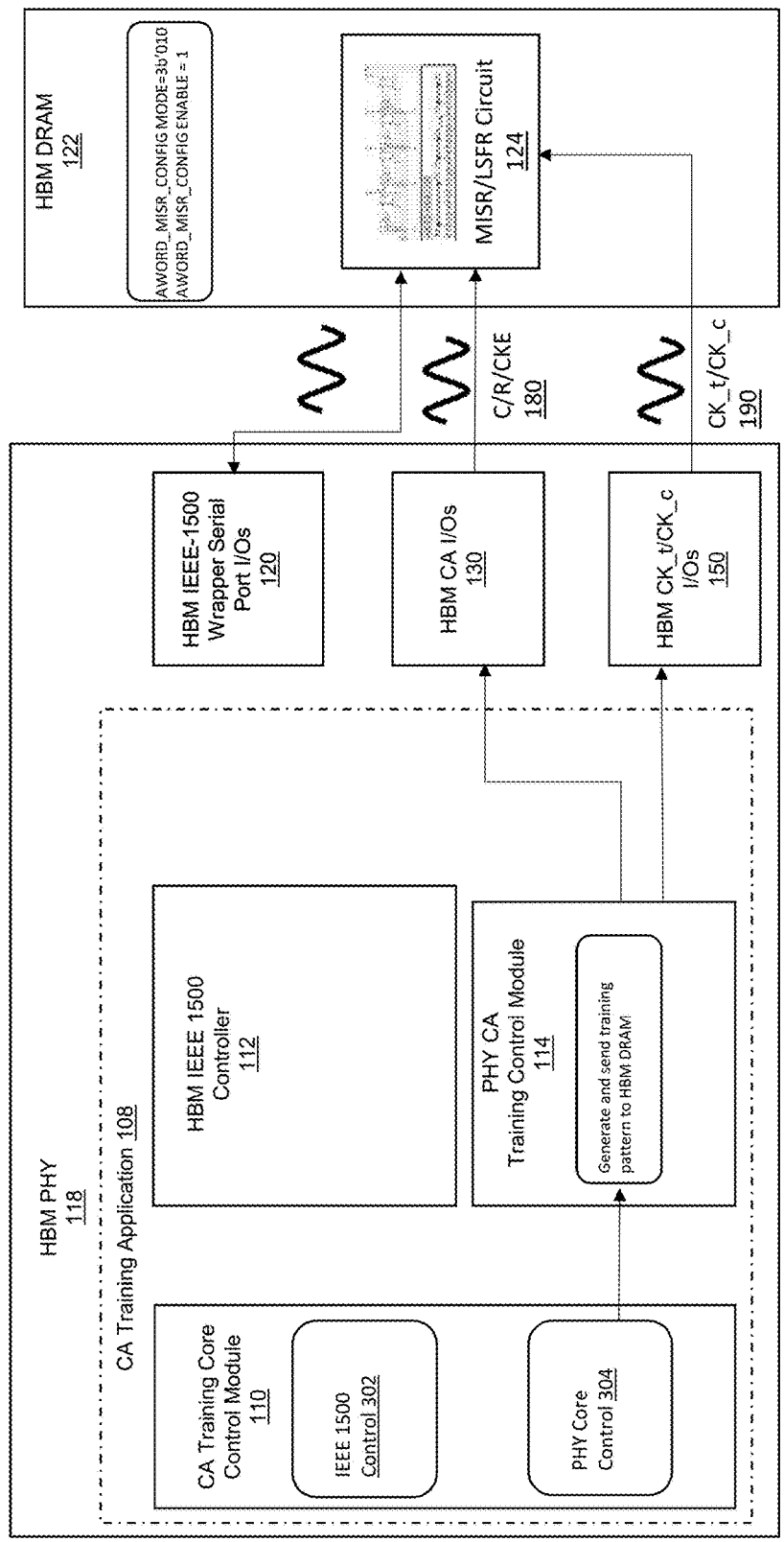

FIG. 3C illustrates the CA Training Application generating and sending a CA training pattern to the HBM DRAM. The CA training pattern is used as a baseline pattern to determine the CA bus setup and hold timing relative to the memory clock. In some embodiments, the CA Training Application 108 generates and sends a CA training pattern to the HBM DRAM 122. In some embodiments, the PHY Core Control 304 asserts a DFI signal (e.g., dfi_calvl_ca_sel) to request the PHY CA Training Control Module 114 to generate and send CA training pattern on C/R bus and CKE 180. The PHY CA Training Module 114 generates and sends a CA training pattern via the HBM CA I/Os 140 to the MISR/LSFR Circuit 124. At the same time, PHY CA Training Module 114 also sends two pulses of clock signals to MISR/LSFR Circuit 124 via the HBM CK_t/CK_c I/Os 150, because according to HBM protocol, MISR/LSFR Circuit 124 uses CK_t/CK_c 190 to capture C/R/CKE 180.

Figure 3D:
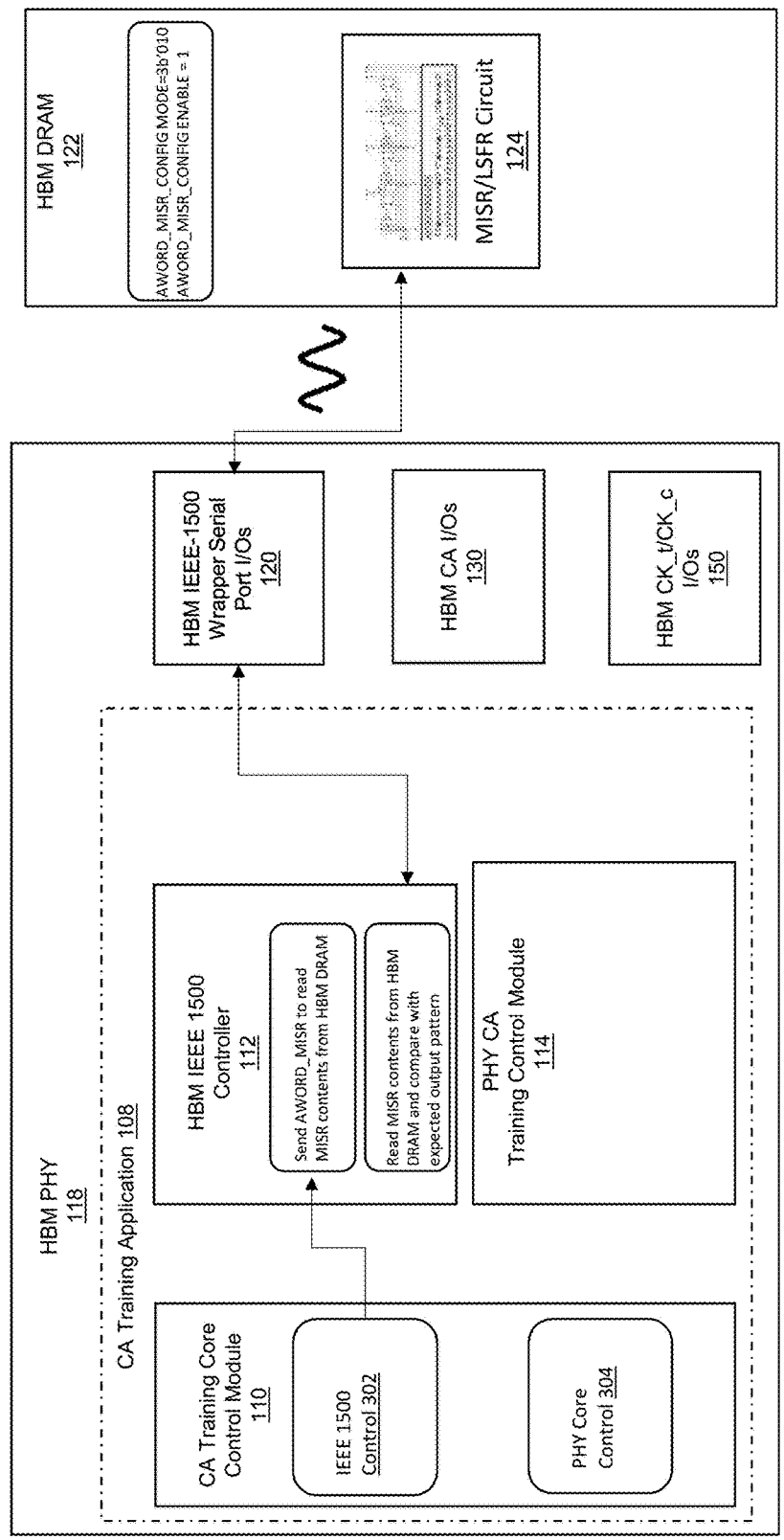

FIG. 3D illustrates the CA Training Application reading the contents of HBM DRAM to determine what the actual timing is on HBM DRAM memory clock and to compare the timing on the output pattern with the expected output pattern. Comparing the timing on the output pattern with the timing on the expected output pattern generates a quantifiable measurement to determine how the delay line on C/R bus and CKE should be adjusted, if at all. The expected training pattern can be a pre-determined parameter. In some embodiments, the CA Training Application 108 reads the MISR/LSFR Circuit 124 contents from the HBM DRAM 122. In some embodiments, the CA Training Core Control Module 110 requests the IEEE 1500 Controller 112 to send a test instruction to read contents from the MISR/LSFR Circuit 124. In some embodiments, The MISR/LSFR Circuit 124 contents are then sent to the HBM IEEE 1500 Controller 112 from the via Wrapper Serial Output (WSO) port 120. In some embodiments, the HBM IEEE 1500 Controller 112 compares the MISR/LSFR Circuit 124 content with the expected pattern stored in the registers.

Figure 3E:
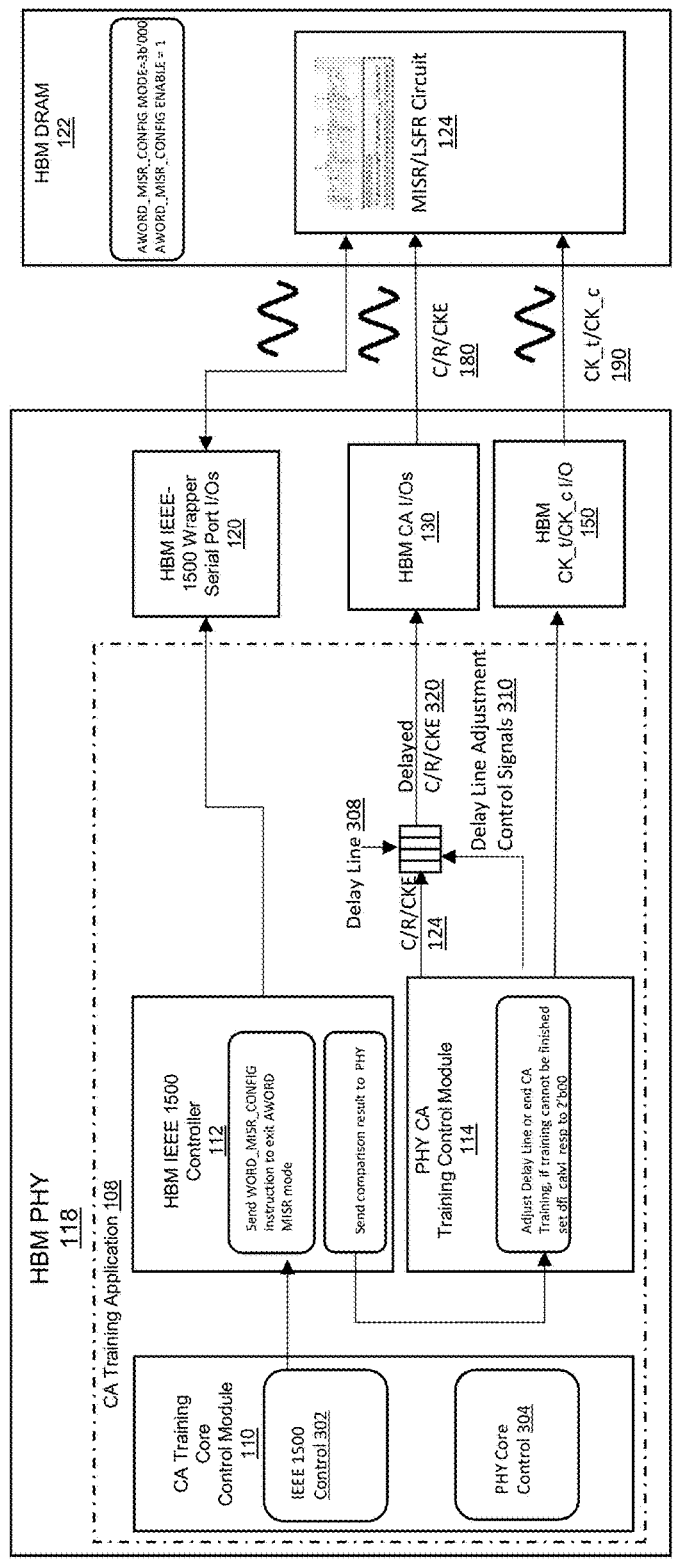

FIG. 3E illustrates the CA Training Application compensating for any timing issues on the HBM DRAM memory clock by adjusting the delay on the C/R bus and CKE. The process of sending and receiving CA training patterns to adjust the delay can be repeated as many times as necessary to decrease the delta value between the output pattern and the expected output pattern. CA training is finished when the best setup/hold timing is found. In some embodiments, the CA Training Application 108 optimizes timings on C/R/CKE paths 180 by adjusting the Delay Line 308 with Delay Line Adjustment Control Signals 310. In some embodiments, the IEEE 1500 Control 302 requests the HBM IEEE Controller 1500 112 to send a test configuration instruction to exit "Register Mode." In some embodiments, the HBM IEEE Controller 112 sends the comparison results to the PHY CA Training Control Module 114. In some embodiments, the PHY CA Training Control 114 adjusts the Delay Line 308 by sending a Delay Line Adjustment Control Signals 310. In some embodiments, the HBM CA I/Os 140 receives a Delayed C/R/CKE 320 signal which is then sent to the MISR/LSFR Circuit 124 as C/R/CKE signal 180 to adjust the timing on the HBM DRAM 122. In some embodiments, when CA training cannot be finished the PHY CA Training Control Module 114 sends a DFI signal (e.g., difi_calvl_resp) to continue CA training and another CA training pattern is sent to the HBM DRAM 122 similar to in FIG. 3C.

Figure 3F:
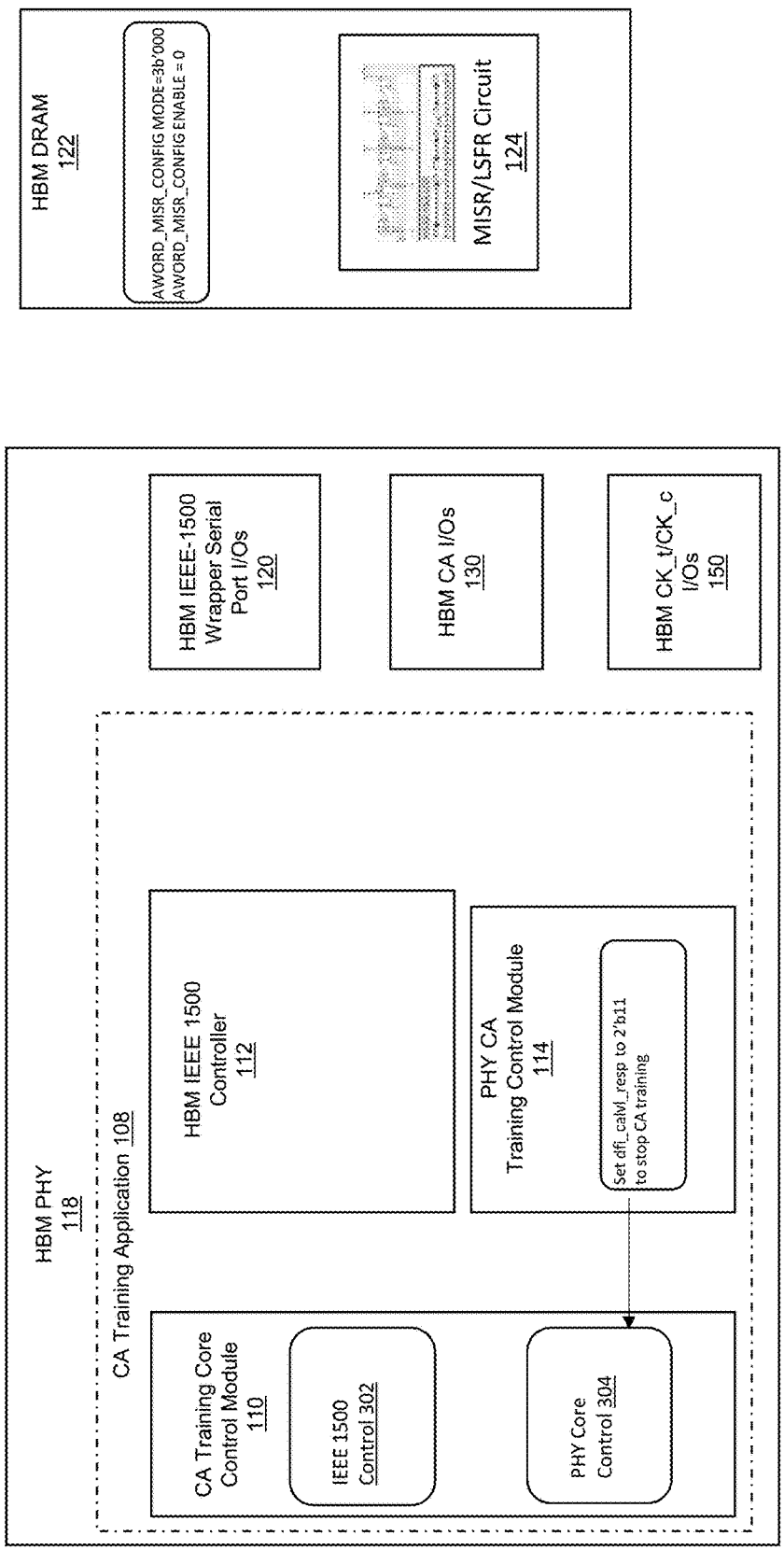

FIG. 3F illustrates the completion of the CA training sequence and sets HBM DRAM back into normal operating conditions. FIG. 3F illustrates completion of the CA Training Application 108. In some embodiments, the PHY CA Training Control module 114 determines that CA training is finished and sets a DFI signal (e.g., difi_calvl_resp) to stop CA training.

Figure 4:
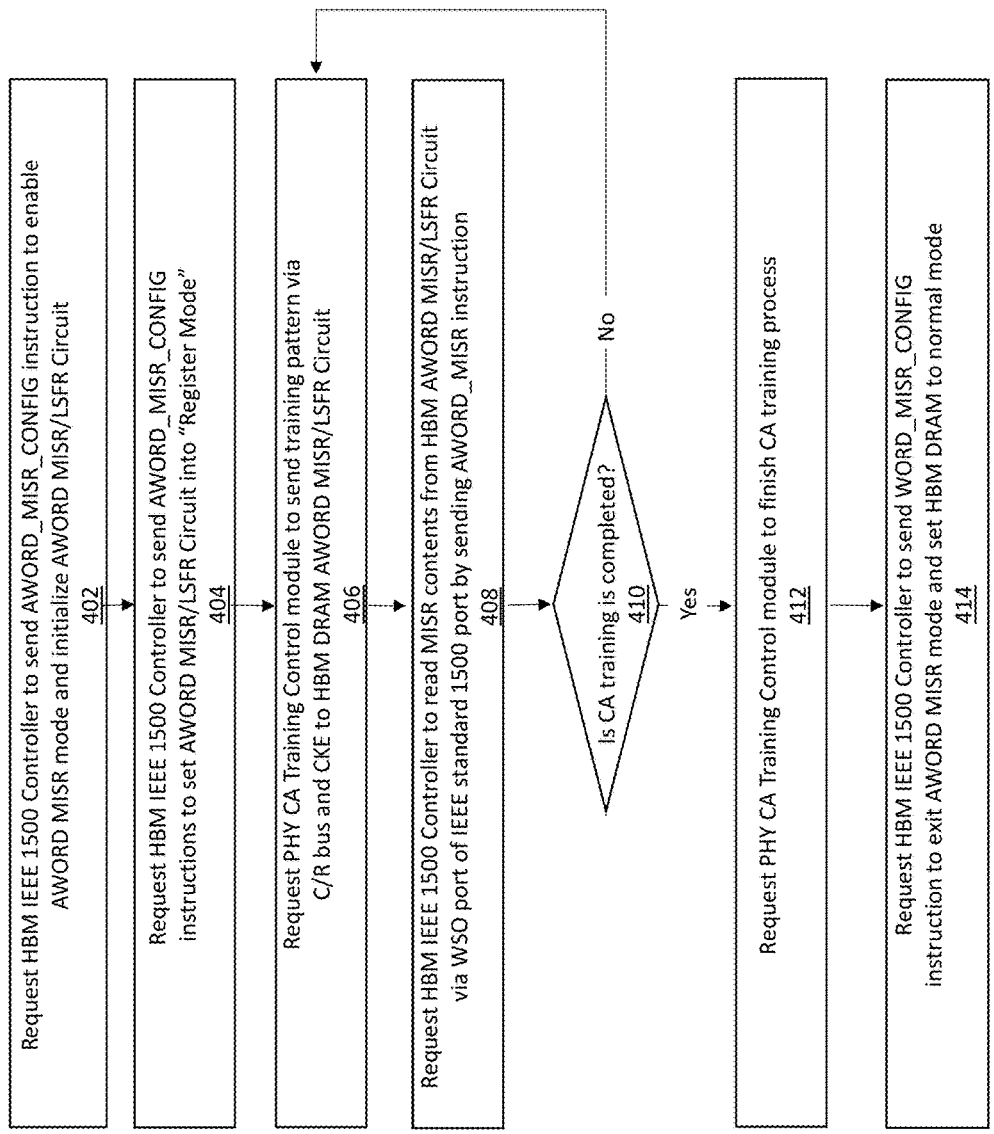
FIG. 4 is a flow diagram illustrating an approach to implement CA training from the perspective of the CA Training Core Control module according to some embodiments of the invention.

FIG. 4 shows a flow diagram illustrating an approach to implement CA training from the perspective of the CA Training Core Control module according to some embodiments of the invention. In one or more embodiments, the method for implementing CA training may include starting the CA training process by asserting a DFI signal.

Generally, the CA Training Core Control functions to requests IEEE 1500 operations from the HBM IEEE 1500 Controller 112. In some embodiments, the process step 402 requests HBM IEEE 1500 Controller 112 to send a test configuration instruction to enable AWORD MISR mode and initialize the AWORD MISR/LSFR Circuit 124. Next, in some embodiments, the process step 404 includes requesting the HBM IEEE 1500 Controller 112 to send a test configuration instruction to set AWORD MISR/LSFR Circuit 124 into "Register Mode." When the MISR/LSFR Circuit 124 is in Register mode, its contents can be set via C/R bus and CKE 180, using CK_t/CK_c 190 as a clock, and its contents can be read out when a test read instruction is sent.

In some embodiments, the process step 406 includes requesting PHY CA Training Control module 114 to send a CA training pattern via the C/R bus and CKE 180 to the HBM DRAM AWORD MISR/LSFR Circuit 124. Next, in some embodiments, the process step 408 may request HBM IEEE 1500 Controller 112 to read MISR Contents from HBM AWORD MISR/LSFR Circuit 124 via WSO port of IEEE Standard 1500 port by sending a test instruction. The WSO is part of an IEEE 1500 standard Wrapper Instruction Register (WIR). The WIR components provide wrapper and core mode control and includes a Serial Control (WSC), Serial Input (WSI), and Serial Output (WSO). In some embodiments, the process step 410 includes waiting for a response from PHY CA Training Control 114 by detecting a DFI signal to determine if CA training can end. If it is determined that CA training is ready to end, then the PHY CA Training Core Module 114 repeats process step 406-410. However, if it is determined that the training should end, then the CA training can end.

In some embodiments, once CA training can end, process step 412 requests PHY CA Training Control module 114 to finish the CA training process. At the same time, in some embodiments, process step 414 requests the HBM IEEE 1500 Controller 112 to send a test configuration instruction to exit AWORD MISR mode and set HBM DRAM 122 back to normal mode.

Figure 5:
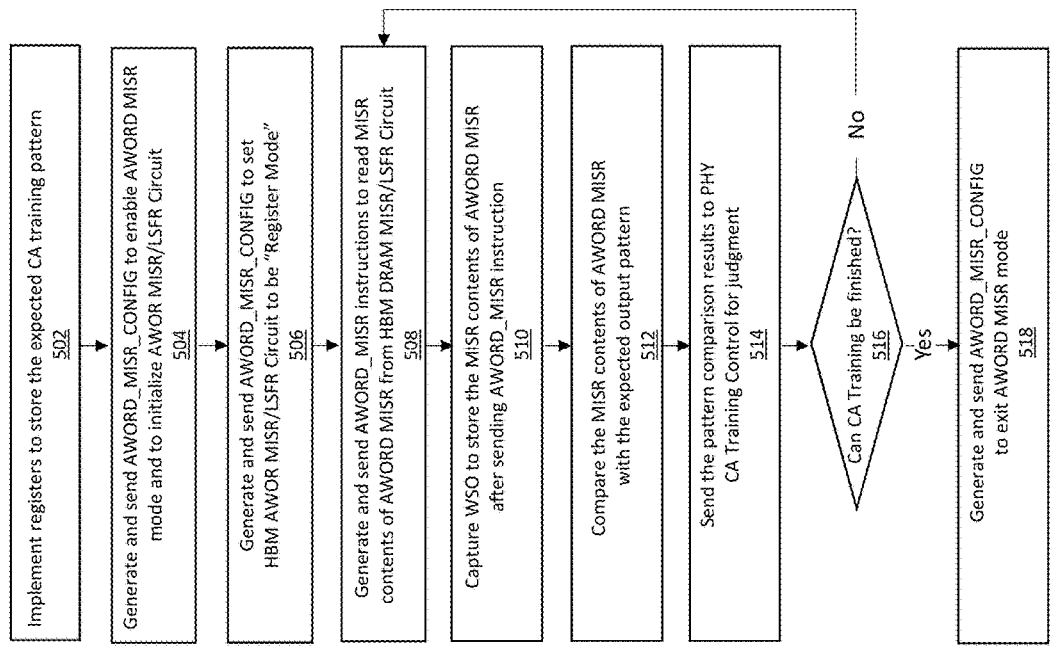
FIG. 5 is a flowchart of an approach to implement CA training from the perspective of the HBM IEEE 1500 Controller according to some embodiments of the invention.

FIG. 5 shows a flowchart of an approach to implement CA training from the perspective of the HBM IEEE 1500 Controller 112 according to some embodiments of the invention. In some embodiments, the method in process step 502 includes implementing registers to store the expected output pattern. In some embodiments, the process step 504 includes generating and sending a test configuration instruction to initialize the AWORD MISR/LSFR Circuit 124. In some embodiments, the process step 506 includes generating and sending a test configuration instruction to set AWORD MISR/LSFR circuit 124 into "Register mode."

In some embodiments, the process step 508 includes generating and sending a test read instruction to read the contents of AWORD MISR from HBM DRAM MISR/LSFR Circuit 124. In some embodiments, the process step 510 includes capturing WSO to store the contents of AWORD MISR after sending a test read instruction.

In some embodiments, the process step 512 includes comparing the contents of the HBM DRAM circuit, received from process step 508 with the expected output pattern stored in process step 502 and sending the comparison results to PHY CA Training Control module 114 at 514. In some embodiments, process step 516 determines whether CA training can be finished. If CA training cannot be finished, then steps 508 to 514 are repeated. If CA training can be finished, then step 518 generates and sends a test configuration instruction to exit AWORD MISR mode.

Figure 6:
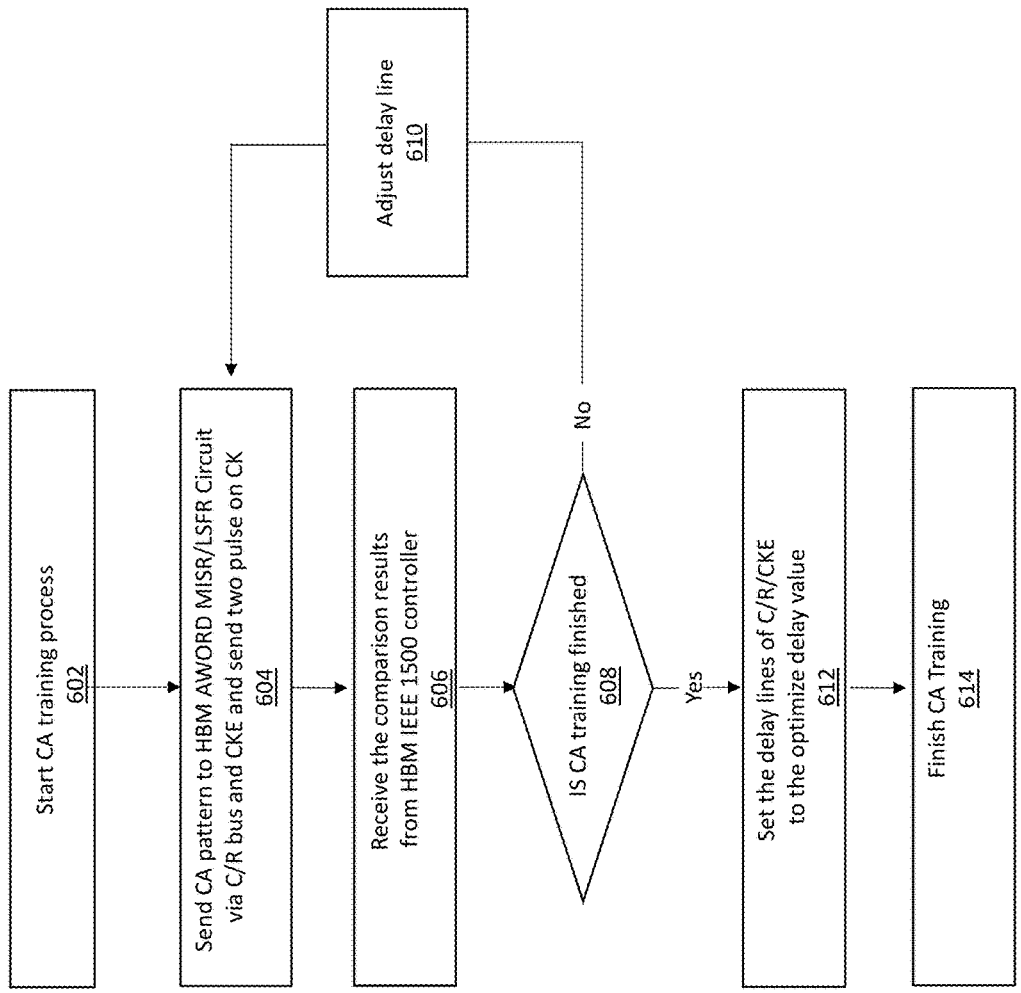
FIG. 6 is a flowchart of an approach to implement CA training from the perspective of the PHY CA Training Control module according to some embodiments of the invention.

FIG. 6 shows a flowchart of an approach to implement CA training from the perspective of the PHY CA Training Control module 114 according to some embodiments of the invention. In some embodiments, the process step 602 comprises detecting the assertion of a DFI signal to start the CA training process.

In some embodiments, the process step 604 includes detecting a DFI signal to send the CA training pattern to HBM AWORD MISR/LSFR Circuit 124 via C/R bus and CKE 180 and, simultaneously, sends two pulses on CK_t/ CK_c 190.

In some embodiments, the process step 606 comprises receiving the comparison results between the output pattern and the expected output pattern from the HBM IEEE 1500 Controller 112. In some embodiments, process step 608 comprises determining whether the CA training can be finished. If CA Training cannot be finished, process step 610 adjust delay line 122 and sends a DFI signal to signal that CA training cannot be finished and repeats process steps 602-604 until CA training can be finished. If CA training can be finished, then step 612 sets the delay lines of C/R/CKE 180 to the optimized delay value at step 612 and stops CA training at process step 614.

Figure 7:
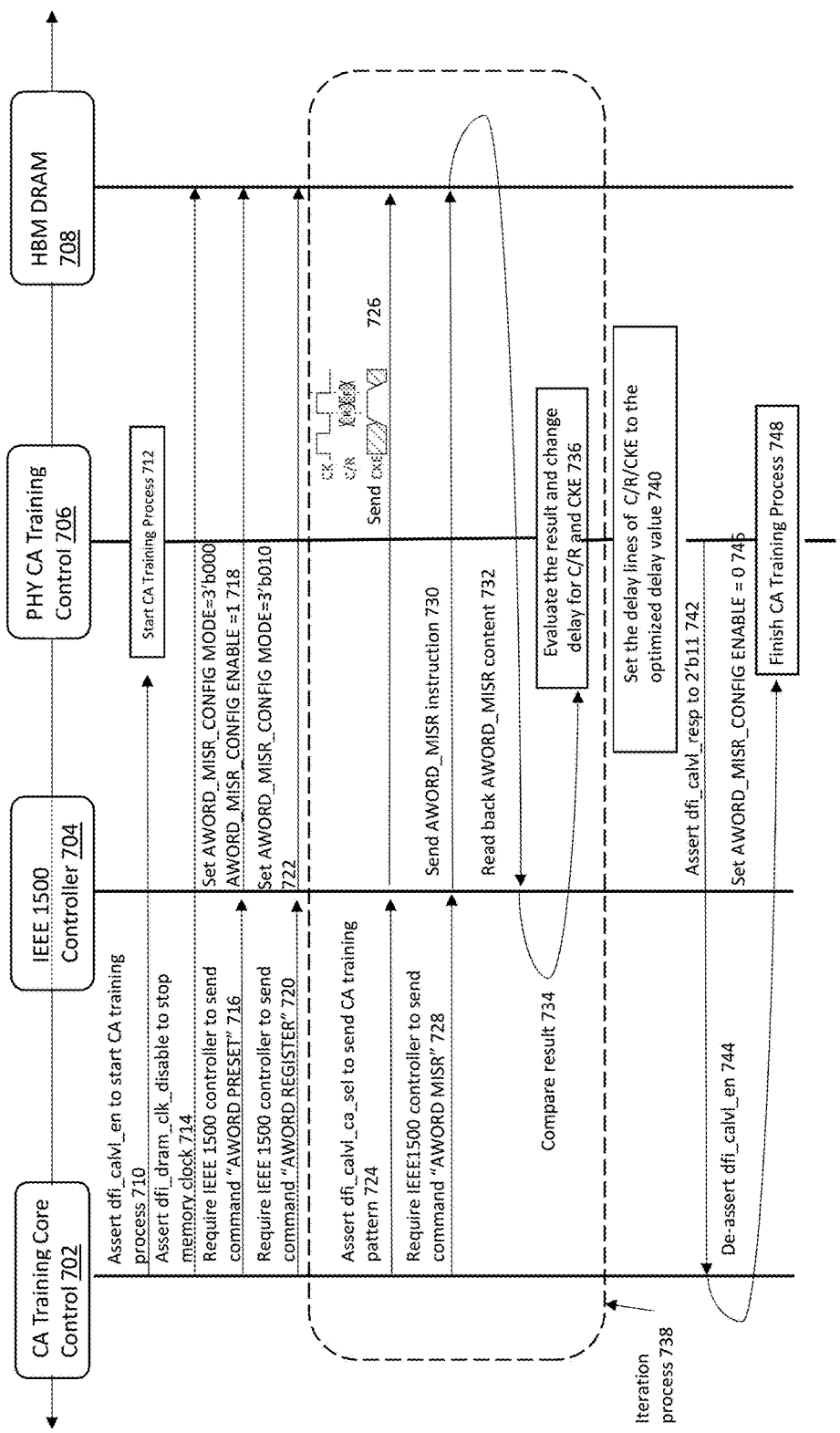
FIG. 7 is a diagram of a processing protocol as used to implement CA training across multiple modules, according to some embodiments.

FIG. 7 shows a diagram of processing protocol as used to implement CA training across multiple modules, according to some embodiments. As an option, the present processing protocol 700 or any aspect thereof may be implemented in the context of the architecture and functionality of the embodiments described herein. Also, the processing protocol 700 or any aspect thereof may be implemented in any desired environment.

The embodiment of FIG. 7 shows a first CA Training Core Control 702, a IEEE 1500 Controller 704, a PHY CA Training Control 706, and a HBM DRAM 708. The interactions implement a protocol to perform as follows: the CA Training Core Control 702 asserts dfi_calvl_en (710) to start the CA training process at the PHY CA Training Control 706 (712), and asserts dfi_dram_clk_disable to stop the memory clock on the HBM DRAM 708 (714). Next, the CA Training Core Control 702 requires the IEEE 1500 controller to send command "AWORD PRESET" (716) which sets AWORD_MISR_CONFIG MODE=3'b000 and AWORD_MISR_CONFIG ENABLE=1 (718) to initialize the AWORD_MISR/LSFR circuit 124. Next, the AWORD_MISR/LSFR circuit 124 is set to "Register" mode by requiring the IEEE 1500 controller 704 to send command "AWORD REGISTER" (720), which sets AWORD_MISR_CONFIG=3'b010 (722).

Next, the CA Training Core Control 702 asserts dfi_calv_ca_sel (724) to send the CA training pattern (726) to the HBM DRAM 708. Then, the contents in AWORD_MISR/LSFR circuit 124 are read back by requiring the IEEE 1500 controller (728) to send command "AWORD_MISR" instructions (728). The IEEE 1500 Controller 704 sends the AWORD_MISR Instruction (730) to the HBM DRAM 708 and the AWORD_MISR content is subsequently read back (732) for comparison. The IEEE 1500 Controller 704 then compares the results between the output pattern and the expected output pattern (734). The PHY CA Training Control 706 evaluates the result and changes delay for C/R and CKE accordingly (736). This iteration process (738) from steps 724-736 are repeated until the best setup/hold timing on C/R bus and CKE are found.

Once the desired setup/hold timing on C/R and CKE are found the PHY CA Training Control 706 sets the delay lines of C/R/CKE to the optimized delay value (740). Then, the PHY CA Training Control 706 asserts dfi_calvl_resp to 2'b11 (742) to inform the CA Training Core Control 702 that CA training can end. Finally, CA Training Core Control 702 de-asserts dfi_calvl_en (744) and sets AWORD_MISR_CONFIG ENABLE=0 (746) to finish the CA Training Process (748).

System Architecture

Figure 8:
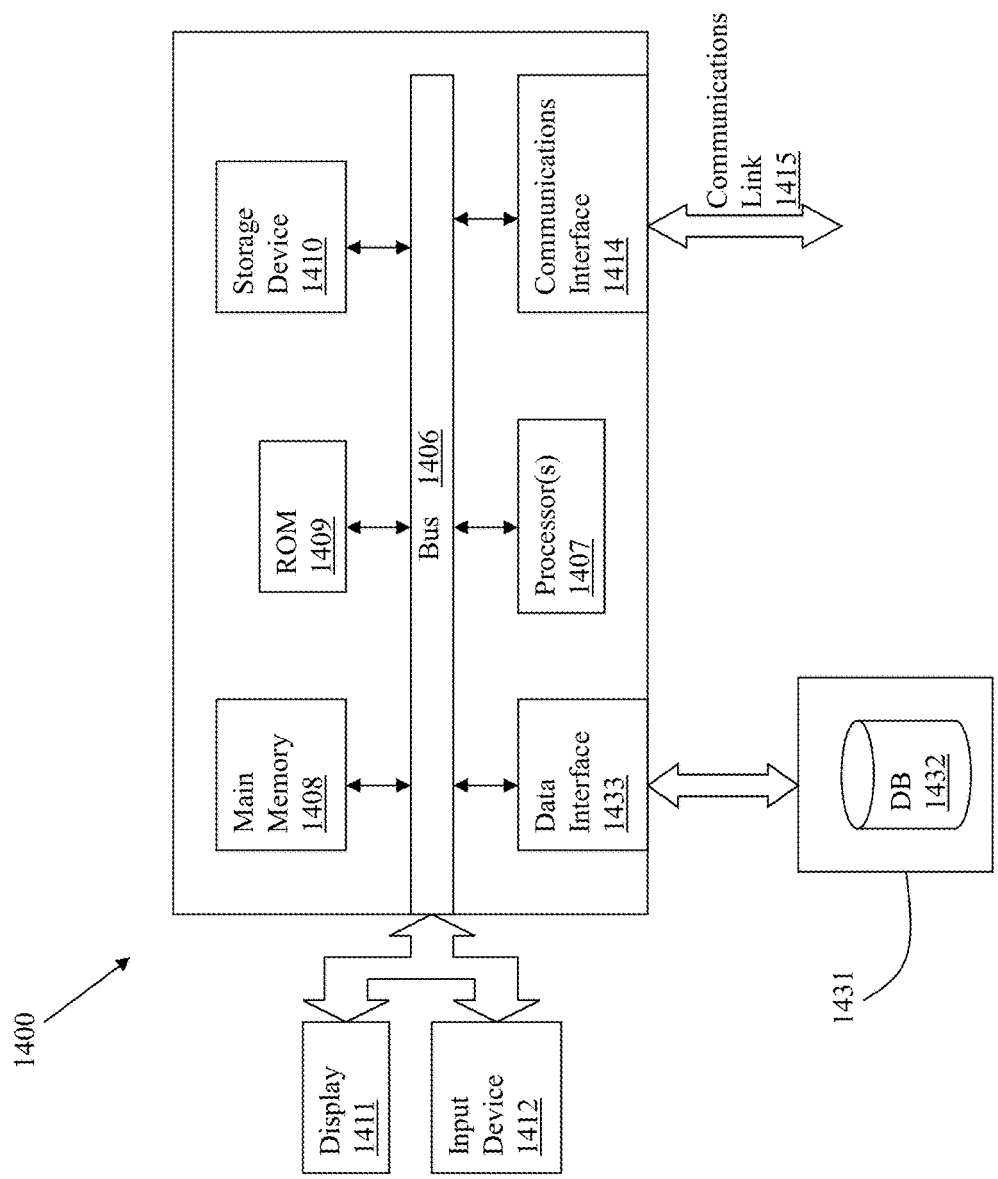
FIG. 8 depicts a block diagram of an instance of a computer system suitable for implementing an embodiment of the present disclosure.

FIG. 8 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet Card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch Cards, paper tape, any other physical medium with patterns of holes, RAM, PROM, EPROM, FLASH-EPROM, any other memory chip or Cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A method for performing Command Address (CA) training on high bandwidth memory (HBM), comprising:
   initializing CA training by sending a first instruction through a wrapper serial port on a HBM mixed-signal physical interface (PHY) to set a Dynamic Random Access Memory (DRAM) into a training mode;
   sending a training pattern to the DRAM;
   reading an output pattern from the DRAM by sending a second instruction via the wrapper serial port on the HBM PHY after sending the training pattern from the DRAM, wherein the second instruction reads contents of the DRAM into the HBM PHY;
   determining whether a CA bus timing problem exists by evaluating a comparison result from comparison of the output pattern to an expected output pattern;
   adjusting a delay line corresponding to the comparison result;
   determining whether CA training is complete; and
   ending CA training mode upon detection of a signal.

2. The method of claim 1, wherein determining whether CA training is complete further comprises:
   sending at least one more training pattern to the DRAM if it is determined that the delay line should be further adjusted; and
   re-adjusting the delay line corresponding to another evaluation of the comparison result.

3. The method of claim 1, comprising sending an IEEE 1500 standard test instruction to at least initialize CA training or end CA training rather than using a register.

4. The method of claim 1, comprising asserting a DDR PHY Interface (DFI) signal to at least initialize CA training or end CA training.

5. The method of claim 1, wherein the expected output pattern is stored by implementing registers.

6. The method of claim 1, wherein reading the output pattern comprises sending a test instruction to read a circuit content.

7. The method of claim 1, wherein the output pattern is received by sending an IEEE 1500 standard test instruction.

8. The method of claim 1, wherein reading the output pattern further comprises capturing Wrapper Serial Output to store a circuit content.

9. The method of claim 1, wherein ending a CA training process comprises detecting at least one signal.

10. The method of claim 1, wherein reading the training pattern from the DRAM comprises setting the DRAM into a Register Mode.

11. The method of claim 1, wherein sending the training pattern comprises detecting at least one DFI Interface signal.

12. The method of claim 1, wherein sending the training pattern comprises storing the training pattern in a 30-bit MISR/LSFR circuit.

* * * * *